(12) United States Patent
Stenz et al.

(10) Patent No.: US 7,392,499 B1
(45) Date of Patent: Jun. 24, 2008

(54) PLACEMENT OF INPUT/OUTPUT BLOCKS OF AN ELECTRONIC DESIGN IN AN INTEGRATED CIRCUIT

(75) Inventors: Guenter Stenz, Campbell, CA (US); Srinivasan Dasasathyan, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 563 days.

(21) Appl. No.: 11/195,216

(22) Filed: Aug. 2, 2005

(51) Int. Cl.
*G06F 17/50* (2006.01)

(52) U.S. Cl. .............................. 716/16; 716/2; 716/12; 716/13; 716/14; 716/15; 326/41

(58) Field of Classification Search .................... 716/2, 716/12–16; 326/41
See application file for complete search history.

(56) References Cited

U.S. PATENT DOCUMENTS

| | | | | |
|---|---|---|---|---|
| 5,079,451 A | * | 1/1992 | Gudger et al. | 326/41 |
| 5,128,871 A | * | 7/1992 | Schmitz | 716/17 |
| 5,594,366 A | * | 1/1997 | Khong et al. | 326/41 |
| 6,215,327 B1 | * | 4/2001 | Lyke | 326/41 |
| 6,653,860 B2 | * | 11/2003 | Agrawal et al. | 326/41 |
| 7,000,212 B2 | * | 2/2006 | Agrawal et al. | 716/17 |
| 7,028,281 B1 | * | 4/2006 | Agrawal et al. | 716/12 |
| 7,149,997 B1 | * | 12/2006 | Young et al. | 716/16 |
| 7,193,433 B1 | * | 3/2007 | Young | 326/38 |
| 7,284,222 B1 | * | 10/2007 | Rohe et al. | 716/12 |
| 7,313,778 B1 | * | 12/2007 | Stenz et al. | 716/17 |
| 2007/0022063 A1 | * | 1/2007 | Lightowler | 706/15 |

\* cited by examiner

*Primary Examiner*—Vuthe Siek
*Assistant Examiner*—Naum B Levin
(74) *Attorney, Agent, or Firm*—LeRoy D. Maunu; Lois D. Cartier

(57) ABSTRACT

Approaches for placing a plurality of input/output blocks (IOBs) of an electronic design in an integrated circuit are disclosed. The electronic design includes at least one input/output bus associated with a plurality of the IOBs, and the IOBs for each input/output bus are assigned to respective sets. For each combination of pairs of the sets a respective weight factor is generated to indicate a degree of coupling between the first and second sets in the electronic design. An order of the sets is generated, and the sets are placed in an ordered series of input/output sites in the integrated circuit according to the order of the sets. A cost function is evaluated for the pairs of the sets. The generating of the order of the sets and the placing of the sets is conditionally repeated responsive to the evaluating of the cost function.

20 Claims, 5 Drawing Sheets

PLACEMENT OF INPUT/OUTPUT BLOCKS OF AN ELECTRONIC DESIGN IN AN INTEGRATED CIRCUIT

FIELD OF THE INVENTION

The present invention generally relates to placement of blocks on an integrated circuit.

BACKGROUND

The development of an integrated circuit may include physical placement of functional blocks of an electronic design on the integrated circuit. For an application-specific integrated circuit (ASIC), various functional blocks may be placed within the area of the ASIC and the functional blocks may be interconnected by routing wires between the placed functional blocks. For a programmable logic device (PLD) integrated circuit, various functional blocks may be placed in programmable input/output and logic resources of the PLD and the functional blocks may be interconnected by programmable routing resources of the PLD.

The large number of possible placements of functional blocks of an electronic design may result in difficulty in finding a good placement that achieves the objectives for the electronic design. Consideration of even a small portion of the possible placements may not be practical. For example, consideration of a small portion of the possible placements using automatic generation of the placements may require more computational time than is practical. In addition, the best placement found in a practical amount of computational time during automatic generation may be significantly inferior to a good placement that is manually generated.

An automatic generation of a placement may result in a placement that does not match certain features of a manually generated placement. For example, a designer of a manually generated placement may systematically place related blocks. The apparently random placements from automatic generation may cause concern on examination by a designer. The placements of input/output blocks (IOBs) of the electronic design may be especially visible to designers because the placement of IOBs affects the design of a printed circuit board designed to carry the integrated circuit. An apparently random placement of IOBs may make development of the printed circuit board more difficult and time-consuming.

The present invention may address one or more of the above issues.

SUMMARY OF THE INVENTION

The embodiments of the invention provide various approaches for placing a plurality of input/output blocks (IOBs) of an electronic design in an integrated circuit. The electronic design includes at least one input/output bus associated with a plurality of the IOBs. In one embodiment, each IOB is assigned to one of a plurality of sets, and the plurality of IOBs for each input/output bus are assigned to a respective one of the sets. For each combination of pairs of the sets, a respective weight factor is generated to indicate a degree of coupling between first and second sets in the electronic design. An order of the sets is generated, and the sets are placed, according to the order of the sets, in an ordered series of input/output sites in the integrated circuit. A cost function is evaluated. The cost function includes summing respective terms for each of the pairs of the sets, each respective term being a product of the respective weight factor for the pair and a distance between a center of the input/output sites of the first set of the pair and a center of the input/output sites of the second set of the pair. The generating of the order of the sets and the placing of the sets is conditionally repeated responsive to the evaluating of the cost function.

In another embodiment, an article of manufacture is provided and includes a processor-readable medium configured with executable instructions for placing a plurality of input/output blocks (IOBs) of an electronic design in an integrated circuit.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
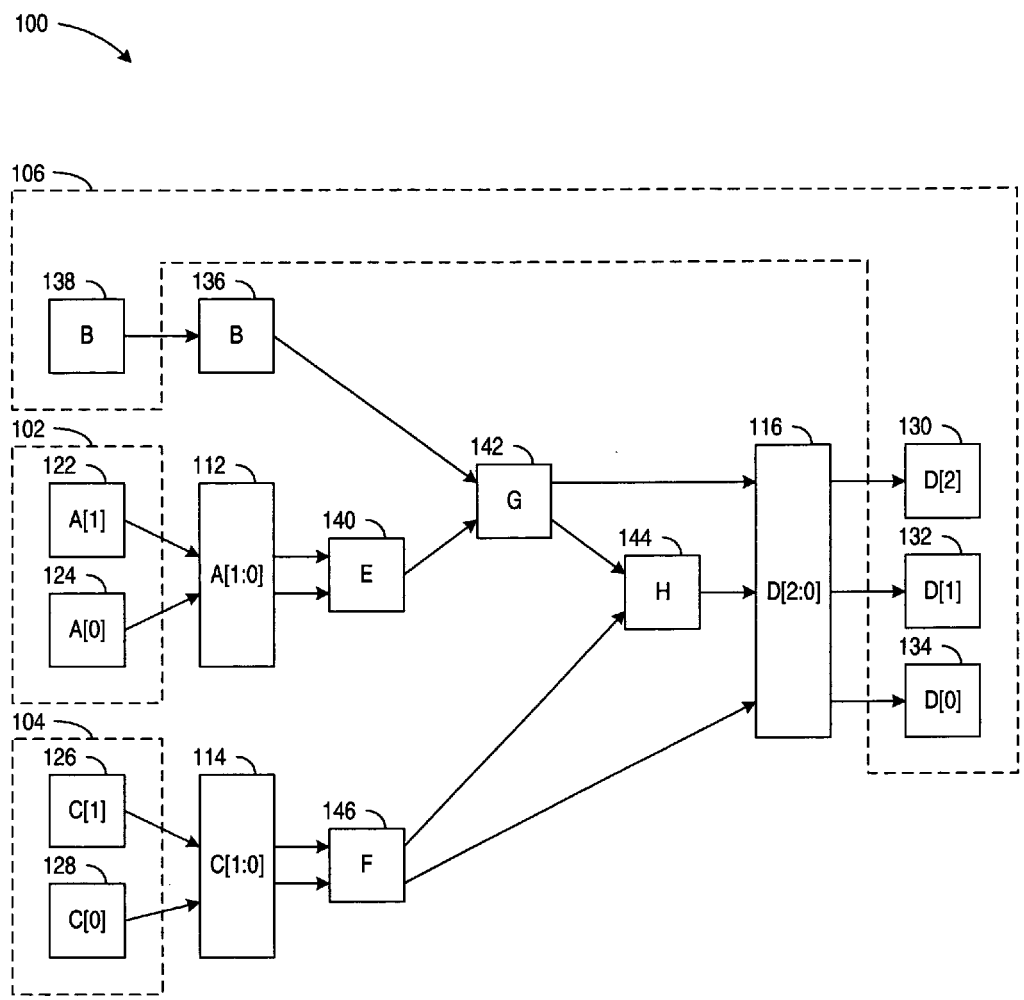
FIG. 1 is a block diagram of an example electronic design with IOBs assigned to sets in accordance with various embodiments of the invention.

FIG. 1 is a block diagram of an example electronic design 100 with IOBs assigned to sets 102, 104, and 106 in accordance with various embodiments of the invention. The IOBs in each set 102, 104, and 106 may be placed together on an integrated circuit implementing the electronic design 100.

Each input/output bus 112, 114, and 116 of the electronic design 100 may be a vector having an associated IOB for each bit of the vector. The A[1:0] input bus 112 may be a vector of two bits with IOB 122 associated with one bit and IOB 124 associated with the other bit. The C[1:0] input bus 114 may be a vector of two bits having associated IOBs 126 and 128. The D[2:0] output bus 116 may be a vector of three bits having associated IOBs 130, 132, and 134. The electronic design 100 may also contain input/output signals, such as input signal 136 having associated IOB 138. Functional blocks 140, 142, 144, and 146 may determine the function of the electronic design 100 that is generated at the outputs of bus 116 from the inputs of signal 136 and buses 112 and 114.

In various embodiments of the invention, a respective set of IOBs is initially created for each input/output bus, and the IOBs associated with the input/output bus are assigned to the respective set. Set 102 may be created for bus input 112, with IOBs 122 and 124 being associated with bus 112 and assigned to set 102. Set 104 may be created for input bus 114, with IOBs 126 and 128 being associated with bus 114 and assigned to set 104. Set 106 may be created for output bus 116, with IOBs 130, 132, and 134 being associated with bus 116 and assigned to set 106. Because IOB 138 is associated with an input/output signal 136 and not an input/output bus, IOB 138 may initially remain unassigned to a set. To complete the assignment of each IOB to a set, each IOB associated with an input/output signal may be assigned to an additional set created for the signal, or the IOB may be assigned to one of the existing sets created for an input/output bus or another input/output signal. Depending on various factors, IOB 138 associated with input signal 136 may be assigned to set 106 for bus 116. It will be appreciated that IOB 138 may instead be assigned to a set of IOBs created for signal 136 or another input/output signal.

In one embodiment, a graph is used to represent the electronic design, and the graph is used to assist in placing the IOBs. The graph includes nodes that represent IOBs and other functional blocks of the electronic design and edges for the nets connecting the IOBs and functional blocks. For example, a graph of design 100 includes nodes corresponding to IOBs 122, 124, 126, 128, 130, 132, 134, and 138, along with nodes corresponding to the functional blocks 112, 114, 116, 136, 140, 142, and 146. Edges in the graph represent the connections between the blocks as shown in design 100. A path between nodes includes at least one edge and possibly one or more intermediate nodes connected with additional edges. For example, a path from IOB 138 to IOB 130 includes the edges that connect function blocks 136, 142, and 116. Those skilled in the art will recognize that the illustration of design 100 in FIG. 1 sufficiently illustrates the corresponding graph of the design and no further illustration of the graph is needed for purposes of understanding the various embodiments of the invention.

In one embodiment, an IOB 138 that is not associated with an input/output bus may be assigned to the set 106 of the IOB 130 having the shortest separation distance (fewest number of intermediate nodes on a path from IOB 138 to IOB 130) from the IOB 138 in the electronic design 100. In another embodiment that is later discussed in detail, an IOB 138 that is not associated with an input/output bus may be assigned to the set 106 of the IOB 130 when the separation distance between the IOB 138 and the closest IOB 130 in the electronic design 100 is less than a separation limit, and otherwise the IOB 138 may be assigned to an additional set.

In certain embodiments, the IOBs may be ordered within each set. For the IOBs associated with an input/output bus, the order within the set may be provided by the order of significance of the bits in the bus. For example, set 106 may be an ordered set and IOBs 130, 132, and 134 may be ordered within set 106 from IOB 130 associated with the most significant bit of bus 116 to IOB 134 associated with the least significant bit of bus 116.

An IOB provides an input/output function of the electronic design 100 that is implemented in an integrated circuit. In one embodiment, an IOB may be a receiver circuit that receives a signal from an input pin of application specific integrated circuit (ASIC). In addition, an IOB may be a driver circuit that drives an output pin of the ASIC. In another embodiment, an IOB may be an input/output function of the electronic design 100 that is implemented in a programmable logic device (PLD) integrated circuit. The input/output function of an IOB may determine the configuration of a programmable input/output site of the PLD. For example, each input/output site of the PLD may be programmable to implement either an input or an output, and an IOB that is placed in an input/output site may determine whether the input/output site is programmed to be an input or an output.

Figure 2:
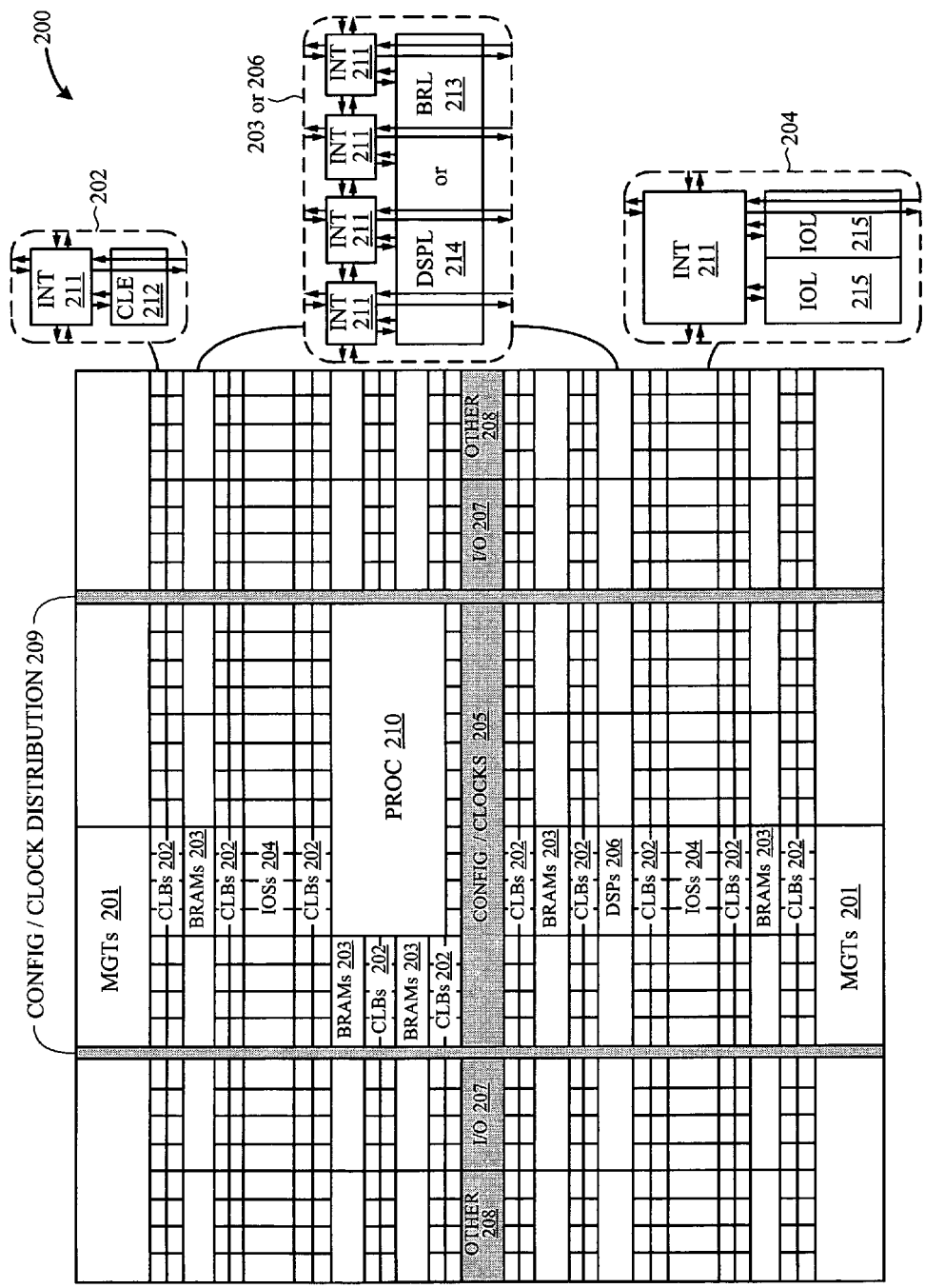
FIG. 2 is a block diagram of a PLD that may be used to implement an electronic design in accordance with various embodiments of the invention.

FIG. 2 is a block diagram of a PLD that may be used to implement an electronic design in accordance with various embodiments of the invention. The PLD has an FPGA architecture 200 that includes an array of programmable tiles including several different types of programmable logic blocks. FPGA architecture 200 may include a large number of different programmable tiles including multi-gigabit transceivers (MGTs 201), configurable logic blocks (CLBs 202), random access memory blocks (BRAMs 203), input/output sites (IOSs 204), configuration and clocking logic (CONFIG/CLOCKS 205), digital signal processing blocks (DSPs 206), specialized input/output sites (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOS 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
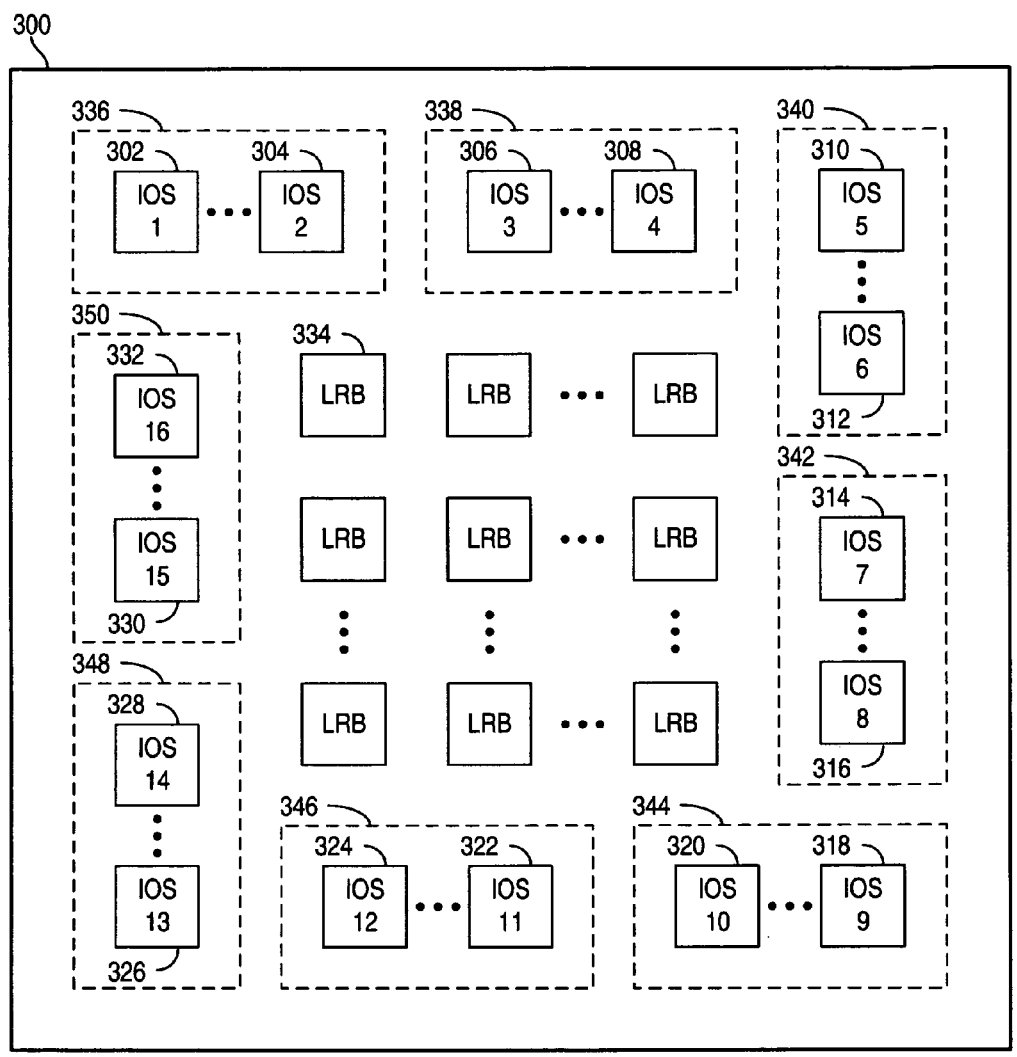
FIG. 3 is a block diagram of an example integrated circuit with an ordered series of input/output sites arranged around the periphery of the integrated circuit in accordance with various embodiments of the invention.

FIG. 3 is a block diagram of an example integrated circuit 300 with an ordered series of input/output sites 302 through 332 arranged around the periphery of the integrated circuit in accordance with various embodiments of the invention. Each IOB of an electronic design may be placed in one of the input/output sites 302 through 332. The electronic design may be implemented in the integrated circuit 300 using the input/output sites 302 through 332 and the logic and routing blocks 334.

In various embodiments of the invention, the input/output sites 302 through 332 are ordered in a series of input/output sites. The input/output sites are ordered such that input/output sites that are near each other in the series tend to be physically near each other in the integrated circuit 300. In one embodiment, the input/output sites 302 through 332 of an integrated circuit 300 are physically arranged around the periphery of the integrated circuit and the ordered series may begin with an input/output site-1 302 followed by the remaining input/output sites 304 through 332 in clockwise order around the periphery of the integrated circuit. It will be appreciated that the order may be counter-clockwise.

The IOBs of a set, such as the set 106 of IOBs of FIG. 1, may be placed in the input/output sites of a contiguous segment of the ordered series. Placing a set of IOBs in the input/output sites of a segment of the ordered series tends to position the IOBs of the set physically nearby each other in the integrated circuit 300. Because the IOBs associated with an input/output bus of the electronic design are included in the same set of IOBs, the IOBs associated with the bus tend to be positioned physically nearby each other in the integrated circuit 300. The placement of the IOBs associated with an input/output bus nearby each other may reduce the routing of wiring on the integrated circuit 300 between the bus and functional blocks of the electronic design that have a high degree of coupling to the bus.

Often, an integrated circuit 300 has input/output sites 302 through 332 that include a corresponding pin or pins of the integrated circuit, or the position of an input/output site on an integrated circuit may otherwise be correlated with the position of a corresponding pin or pins of the integrated circuit. Thus, placing a set of IOBs in the input/output sites of a segment of the ordered series may tend to position the pins for a corresponding input/output bus nearby each other on the integrated circuit 300. The integrated circuit 300 is generally mounted on a printed circuit board of an electronic system. Positioning the pins for an input/output bus nearby each other may simplify the generation of the routing of the printed circuit board for the electronic system. In addition, the printed circuit board may have less wiring resulting in a potentially higher system clock rate and corresponding improved performance for the electronic system. It will be appreciated that the input/output sites 302 through 332 may be ordered in the series based on the positions of pins corresponding to the input/output sites instead of the positions of the input/output sites.

A placement of IOBs in input/output sites of an integrated circuit 300 such that the IOBs for each input/output bus are placed in a series of adjacent input/output sites 302 through 332 may correspond to a manual placement of IOBs. Correspondence to a manual placement of IOBs may improve a designer's understanding of the placement of IOBs and increase the designer's confidence that the placement is a high-quality placement. In addition, a placement, which has sets of IOBs placed in respective segments of an ordered series of input/output sites, may be concisely specified. For example, such a placement of IOBs may be concisely specified by an order of the sets of IOBs. The corresponding placement of IOBs may place the sets of IOBs into the ordered series of the input/output sites in the specified order of the sets. In one embodiment, each set of IOBs is an ordered set and the order of the sets can be combined with the order within each of the sets to provide an order for all of the IOBs. A placement of the IOBs may place each IOB into the ordered series of the input/output sites 302 through 332 according to the order for all of the IOBs. For an integrated circuit with more input/output sites 302 through 332 than IOBs, a placement may further include skipping certain of the input/output sites during the placement of IOBs in the input/output sites.

A process for determining a good placement for an electronic design may iteratively evaluate various placement alternatives. Placing each set of IOBs in a segment of an ordered series of input/output sites 302 through 332 may reduce the alternatives considered during the placement process. Reducing the alternatives considered may increase the efficiency of determining a good placement for the electronic design in an integrated circuit 300.

In certain integrated circuits 300, such as certain PLDs, the input/output sites may be grouped into banks 336 through 350 of input/output sites, for example, bank 336 may include input/output sites 302 and 304. In certain PLDs, while each input/output site 302 through 332 may be programmed to implement a variety of communication protocols for an IOB, the input/output sites in a particular bank, such as input/output sites 302 and 304 in bank 336, should be programmed to implement compatible communication protocols. Each bank 336 through 350 may have separate power supply pins that may determine the voltage levels driven by the input/output sites that are programmed to be an output in the bank, and the threshold level of the input/output sites that are programmed to be an input in the bank. Compatible communication protocols may have the same or similar driving voltage levels and the same or similar receiving threshold levels. It will be appreciated that other rules in addition to compatible voltage levels may determine the compatible communication protocols for the input/output sites for each bank 366 through 350.

The ordered series of input/output sites may be ordered such that the input/output sites of a bank are included in a contiguous segment of the ordered series for each of the banks 336 through 350. The IOBs associated with an input/output bus usually use the same communication protocol, and in certain embodiments the IOBs in each set use compatible communication protocols. During placement of a set of IOBs in an order for the sets, the IOBs of the set may be placed in the input/output sites of the next bank when these IOBs use a communication protocol that is incompatible with the IOBs of the previously placed set. For example, a first set in the order for the sets may contain a first IOB specifying a first protocol and a second set may contain a second IOB specifying a second protocol that is incompatible with the first protocol. The ordered series of input/output sites may begin with input/output site 302 followed by input/output sites 304 through 332. The first IOB may be placed in the first input/output site 302 and the second IOB would be placed in input/output site 304 except that the second IOB uses a communication protocol that is incompatible with the first IOB. Instead, the second IOB is placed in input/output site 306 of the next bank 338 in the ordered series of input/output sites.

Figure 4:
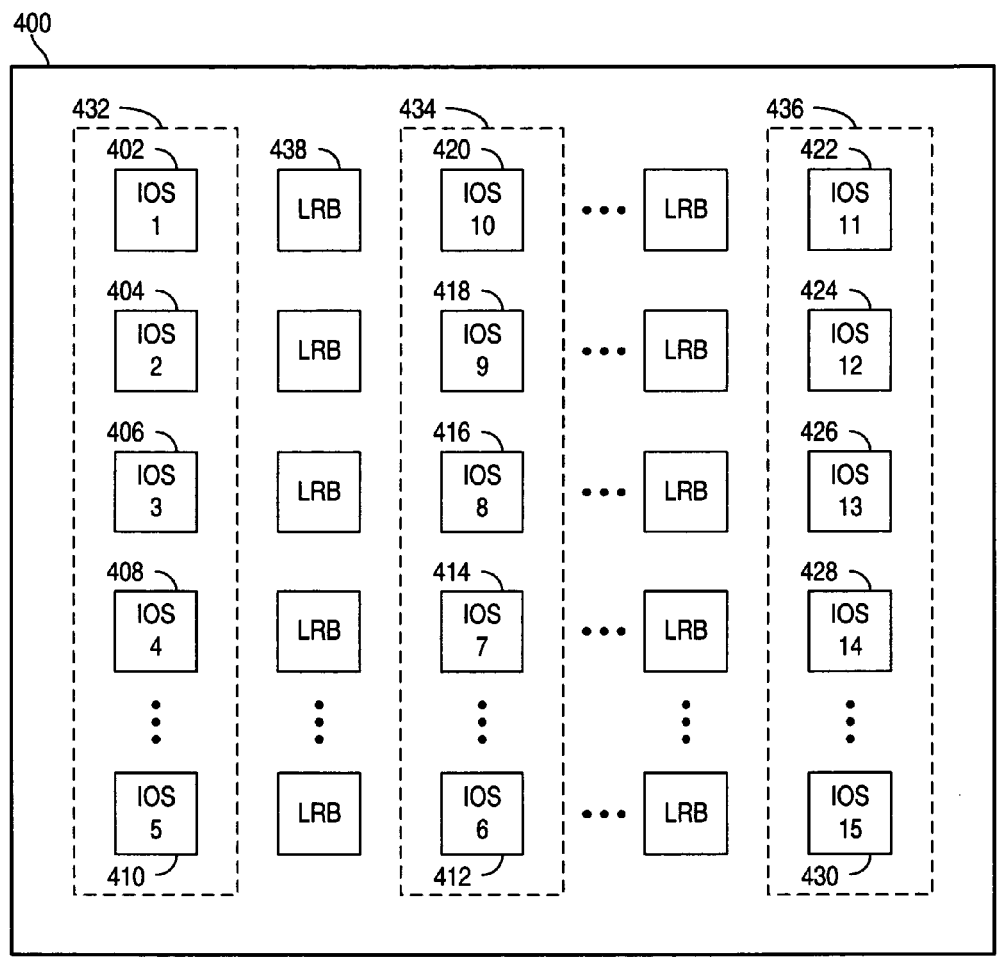
FIG. 4 is a block diagram of an example integrated circuit with an ordered series of input/output sites arranged in columns in accordance with various embodiments of the invention.

FIG. 4 is a block diagram of an example integrated circuit 400 with an ordered series of input/output sites 402 through 430 arranged in columns 432, 434, and 436 in accordance with various embodiments of the invention. Each IOB of an electronic design may be placed in one of the input/output sites 402 through 430. The electronic design may be implemented in the integrated circuit 400 using the input/output sites 402 through 430 and the logic and routing blocks 438.

In one embodiment, the input/output sites 402 through 430 of an integrated circuit 400 are physically arranged in columns 432, 434, and 436, and the ordered series may begin with an input/output site-1 402 in a corner of the integrated circuit 400 followed by input/output sites 404, 406, 408, and 410 along column 432. The ordered series may continue from input/output site-5 410 at an end of column 432 to the adjacent input/output site-6 412 at an end of the adjacent column 434. The ordered series may continue this raster ordering of the input/output sites through the remaining input/output sites 414 through 430. The raster order for the ordered series of input/output sites may successively include the IOBs of each column 432, 434, and 436 from left to right, with the IOBs of each column ordered from top to bottom for alternate columns beginning with the first column 432 and from bottom to top for alternate columns beginning with the second column 434. The input/output sites are ordered such that input/output sites 402 through 430 that are near each other in the series tend to be physically near each other in the integrated circuit 400.

The IOBs associated with each input/output bus of the electronic design are in a respective set of IOBs. The sets of IOBs also include the IOBs associated with the input/output signals of the electronic design. An IOB associated with an input/output signal may be included in a set that includes an IOB or IOBs that have a high degree of coupling to the IOB associated with the input/output signal. A placement that places the IOBs of a set in successive input/output sites in an ordered series of input/output sites may tend to position the IOBs of the set physically nearby each other in the integrated circuit 400. Because an IOB associated with an input/output signal may be included in a set containing other shortest-separation-distance IOBs, the IOB associated with the signal tends to be positioned physically nearby the other shortest-separation-distance IOBs in the integrated circuit 300. The placement of the IOB associated with an input/output signal nearby other shortest-separation-distance IOBs may reduce the routing of wiring on the integrated circuit 300 between these IOBs and the functional blocks responsible for the high degree of coupling.

In certain integrated circuits 400, such as certain PLDs, the input/output sites may be grouped into one or more banks for each column 432, 434, and 436. For example, column 432 may correspond to a bank of the integrated circuit 400 that includes input/output sites 402, 404, 406, 408, and 410. The ordered series of input/output sites may be ordered such that the input/output sites of a bank are included in a contiguous segment of the ordered series for each of the banks. During placement of a set of IOBs in an order for the sets, the IOBs of the set may be placed in the input/output sites of the next bank when these IOBs use a communication protocol that is incompatible with the IOBs of the previously placed set.

Figure 5:
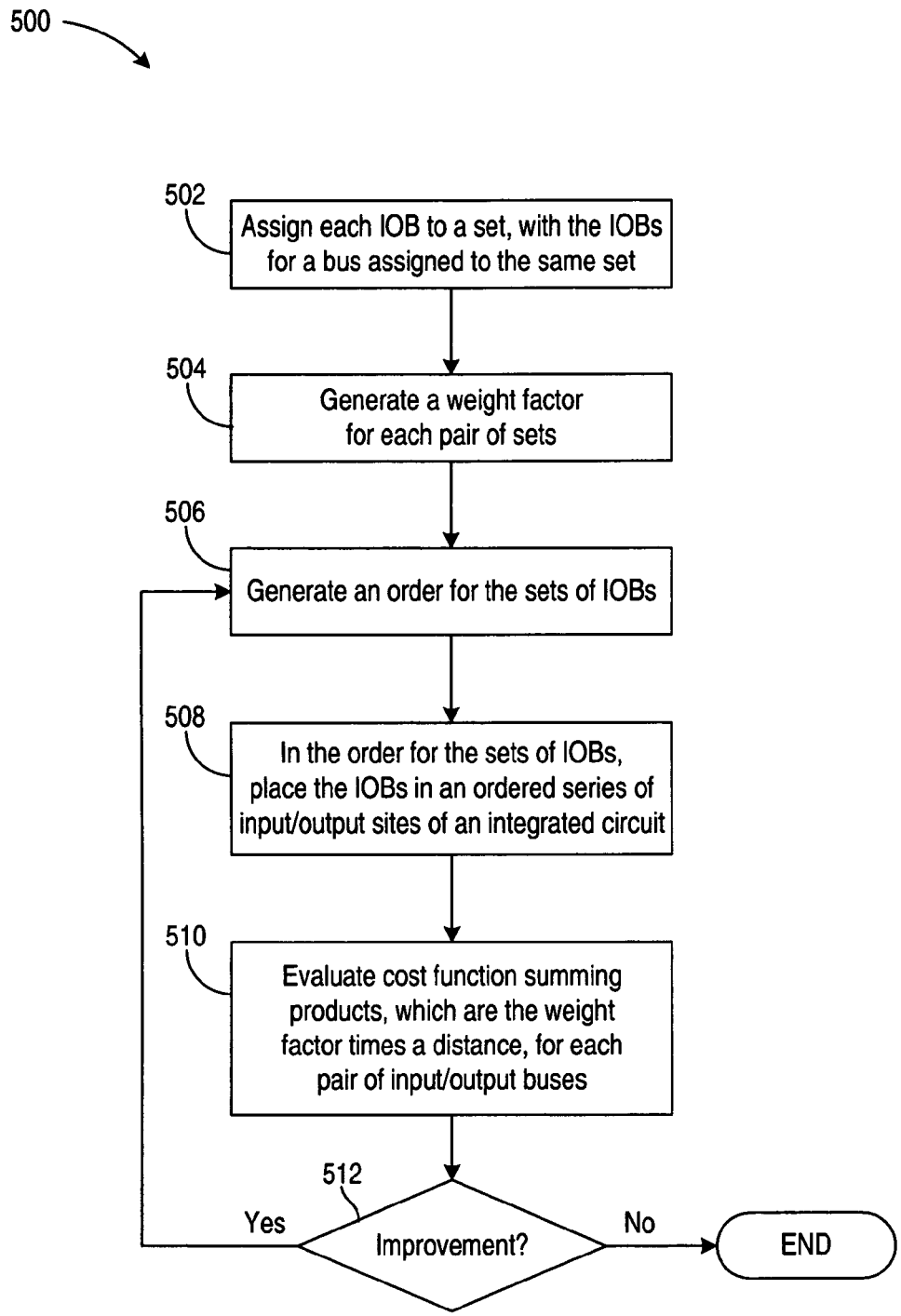
FIG. 5 is a flow diagram of a process for placement of IOBs in accordance with various embodiments of the invention.

FIG. 5 is a flow diagram of a process 500 for placement of IOBs in accordance with various embodiments of the invention. The process efficiently produces a placement of IOBs that may reduce wiring in an integrated circuit and in a printed circuit board to which the integrated circuit is mounted. The placement of IOBs may have characteristics that are similar to a manually generated placement.

At step 502, each IOB of an electronic design is assigned to a set of IOBs. Certain ones of the IOBs may be associated with input/output buses of the electronic design, and the IOBs associated with each input/output bus are assigned to a respective set for the bus. Certain other ones of the IOBs may be associated with input/output signals of the electronic design. The IOBs associated with the input/output signals may be assigned to sets based on the degree of coupling of these IOBs to other IOBs that are each already assigned to a set.

The input/output buses of an electronic design can be identified in a synthesized netlist of the electronic design using information from a specification of the electronic design, for example, a Verilog or VHDL specification. Information identifying the buses of the electronic design may be extracted from the specification and provided to process 500 along with the synthesized netlist for the electronic design. Alternatively, the input/output buses can be identified using the names of the IOBs in the synthesized netlist of the electronic design. These names for the IOBs of input/output buses may be a root name followed by an integer in brackets or another similar naming scheme. An example input/output bus has associated IOBs with the names D[0], D[1], and D[2]. IOBs with a matching root name are IOBs associated with an input/output bus of the electronic design, and these IOBs are be assigned to the same set.

IOBs associated with input/output signals are IOBs that are not associated with input/output buses. In one embodiment, an IOB associated with an input/output signal is assigned to a set using a breadth first search of the graph representing the synthesized netlist of the electronic design. Pseudocode that describes an example process for assigning an IOB associated with an input/output signal to a set is set forth in Example 1 below.

Example 1

```
Proc AssignIOBToSet ( IOB, MaxLevels )
    NumLevels = 0; Queue = { IOB };
    MarkBlocksUnprocessed ( );
    MarkProcessed ( IOB );
    While ( NumLevels < MaxLevel && ! Queue.empty ( ) ){
        NextQueue = { };
        Foreach ( CurrentBlock In Queue ) {
            Set = GetSet ( CurrentBlock );
            If ( Set != NIL && IsCompatible ( IOB, Set ) )
                AssignToSet ( IOB, Set ); Return;
            Neighbors = GetUnprocessedNeighbors ( CurrentBlock );
            MarkProcessed ( Neighbors );
            NextQueue = NextQueue U Neighbors;
        }
        Queue = NextQueue;
        NumLevels++;
    }
    CreateNewSet ( IOB );
    Return;
```

The example process has a first input parameter that identifies the input IOB that is associated with an input/output signal and a second input parameter, MaxLevels, that provides a threshold for a degree of coupling between IOBs. When the separation in levels of intermediate blocks between the input IOB and another IOB is less than the separation limit of MaxLevels, then these IOBs have a high degree of coupling and the input IOB may be assigned to the set of the other IOB. When the separation between the input IOB and every other IOB is at least MaxLevels, then the input IOB has a low degree of coupling to every other IOB and a new set is created for the input IOB. Generally, the degree of coupling between IOBs may be the number of levels of intermediate blocks separating the IOBs. The example process completes with the input IOB being assigned either to a new set or to an existing set including another IOB having a high degree of coupling to the input IOB.

The example process begins by initializing variables and marking all blocks unprocessed in the graph for the synthesized netlist. Each iteration of the "While" loop investigates an expanding level of intermediate blocks around the input IOB until either the separation limit for the number of levels is reached or the entire synthesized netlist is examined. The "Foreach" loop considers each block in a queue containing the IOBs and the functional blocks for a particular level of intermediate blocks around the input IOB. Because functional blocks are not assigned to sets, the set for a functional block is "NIL". The set is also "NIL" for IOBs, such as the input IOB, that have not yet been assigned to a set. For each IOB considered that is assigned to an existing set, the existing set is checked for compatibility with the input IOB. If the existing set is compatible, then the example process completes by assigning the input IOB to the existing set.

The unprocessed neighbors of each block considered in the "Foreach" loop are added to a next queue for the next level of intermediate blocks around the IOB and these unprocessed neighbors are marked processed. When the "Foreach" loop has considered all the blocks in a particular level of intermediate blocks, the next queue becomes the queue for the next iteration of the "Foreach" loop, which considers each block in the next level of intermediate blocks around the input IOB.

In one embodiment, each set of IOBs is an ordered set and when a compatible set is found that includes a coupled IOB within the separation limit from the input IOB, the input IOB may be added to the ordered set in a position in the ordered set that is adjacent to the coupled IOB. In another embodiment, the input IOB may be added to the ordered set in a position at an end of the ordered set.

At step 504 in FIG. 5, a weight factor is generated for each pair of sets. The weight factor for a pair of sets of IOBs indicates a degree of coupling between the sets in the electronic design. The degree of coupling between two sets may indicate the number of signals that need to be routed between the sets after a reduction for any sharing of these signals with other blocks. In one embodiment, the degree of coupling between a first set of IOBs and a second set of IOBs may be determined from the degree of coupling between each IOB of the first set and each IOB of the second set. The direction of the signals in the electronic design may be ignored when determining the degree of coupling between two IOBs. The weight factor w(i) for a pair of sets B(j) and B(k) may be determined using a breadth-first search of a graph for the synthesized netlist of the electronic design. A wavefront starting in breadth-first search manner from IOB b(r) of set B(j) may reach IOB b(s) of set B(k) after traversing L levels of intermediate blocks. The pair of IOBs b(r) and b(s) contribute a degree of coupling having a value of 1/L to the weight factor w(i) The weight factor w(i) for the pair of sets B(j) and B(k) is obtained by summing similar contribution values for each pairing of an IOB from set B(j) and an IOB from set B(k). It will be appreciated that IOB b(r) of set B(j) might not be coupled to IOB b(s) of set B(k) for certain electronic designs and then the pairing of IOBs b(r) and b(s) contributes a value of zero to the weight factor w(i).

In another embodiment, the breadth-first search may be shortened by limiting the search to at most Tlevels. Paths between IOBs that include more than T levels are not considered during calculation of the weight factors. When an IOB b(r) of set B(j) is not coupled within T levels to an IOB b(s) of set B(k), then the pairing of IOBs b(r) and b(s) contributes a value of zero to the weight factor w(i) for the pair of sets B(j) and B(k). Shortening the breadth-first search to at most Tlevels may improve the efficiency of generating the weight factors.

In yet another embodiment, the weight factors may be generated before a synthesized netlist is available. The hierarchy of the electronic design and/or the connectively at the module level in a partially completed electronic design may be used to generate the weight factors.

At step 506, an order is generated for the sets of IOBs. An initial order may be randomly generated and each subsequent order for each iteration of step 506 may modify a prior order, which may be the preceding order, by randomly selecting two sets and swapping the positions of these two sets in the prior order. Generally, when an improved order is generated at step 506 that results in an improved placement of the IOBs, the next iteration of step 506 modifies this improved order. The prior order that is modified in step 506 may be determined by a simulated annealing approach, as discussed below.

At step 508, the IOBs are placed in input/output sites of the integrated circuit. Each set of IOBs may be successively placed in the order generated in step 506 for the sets. The input/output sites of the integrated circuit may be ordered in an ordered series having nearby input/output sites in the ordered series tending to be physically nearby in the integrated circuit. Successive sets of IOBs in the order generated in step 506 may be placed in successive input/output sites in the ordered series of input/output sites. The pseudocode in Example 2 below illustrates a process for placing sets of IOBs into an ordered series of input/output sites of an integrated circuit.

---

Example 2

Proc Place ( OrderOfSets, NumberOfSets )
    i = 0; coord = 0;
    While ( i < NumberOfSets ) {
        Set = OrderOfSets [ i ];
        If ( ! CanPlace ( Set, coord ) )
            coord = StartOfNextBank ( coord );
        Position ( Set ) = coord;
        coord = coord + Length ( Set );
        i++;
    }
    Return;

---

The "While" loop successively places each set of IOBs in the order of the sets. When attempting to place a set of IOBs at the current coordinate value in the ordered series of input/output sites, the set is checked for compatibility with the previously placed sets. The current coordinate value may be in a bank in which one or more sets have already been previously placed. The bank may be set to a particular group of communication protocols due to the previously placed sets and this particular group of communication protocols may be incompatible with the communication protocol for the current set to be placed. When the current set to be placed is incompatible with the bank at the current coordinate value, the remaining input/output sites in the bank are skipped and the current coordinate value is increased to the start of the next bank. After determining the coordinates of a set of IOBs in the ordered series of input/output sites, the current coordinate value is increased by a length that may be the number of IOBs in the set.

The example process for placing sets of IOBs provides a coordinate in the ordered series of input/output sites for each set of IOBs. In certain embodiments, each set of IOBs may be an ordered set. The IOBs of an ordered set of IOBs may be placed in successive input/output sites in the ordered series beginning at the coordinate for the ordered set in the ordered series.

In another embodiment when the utilization of the input/output sites by the IOBs is low, the IOBs may be distributed across the integrated circuit by skipping additional input/output sites after the placement of certain sets of IOBs.

At step 510, a cost function is evaluated that provides an assessment of the quality of the placement. The cost function may provide a relative indication of the amount of wiring on the integrated circuit for the placement. The cost function may be a sum of a product for each pair of sets of IOBs. The product for a pair of sets may be the weight factor generated at step 504 for the pair of sets times a distance for the pair of sets. In one embodiment, the cost function is given by:

$$C = \sum_i w(i)[\text{ABS}(x(S(i)) - x(D(i))) + \text{ABS}(y(S(i)) - y(D(i)))]$$

The summation index i is over all pairings of a first set S(i) of IOBs and a second set D(i) of IOBs. The x and y coordinates in the integrated circuit of a set B are given by x(B) and y(B), respectively. The x and y coordinates of a set B may be the x and y coordinates of a center of the set B, and the center of the set B may be a centroid, or average position, of the x and y coordinates of the IOBs in the set B. The absolute value of the difference between the x coordinates of sets S(i) and D(i) added to the absolute value of the difference between the y coordinates of sets S(i) and D(i) yields a Manhattan distance between the sets S(i) and D(i). The summation of the products of the weight factor times this Manhattan distance for each pairing of sets provides the value of the cost function for the placement of IOBs. In another embodiment, some or all of the sets, and especially sets with more IOBs, may have multiples centers to increase the accuracy of the cost function.

Step 510 may include determining a "delta" difference between the value of the cost function for the current order of the sets and the value of the cost function from a previous iteration of step 510 for a prior order of the sets. When the delta indicates a decrease in the cost function, the cost function provides an assessment that the current order of sets produces an improved placement of the IOBs in the integrated circuit. Generally, when the current order of the sets produces an improved placement, the current order becomes the ordered modified in the next iteration of step 506. When the current order does not produce an improved placement as indicated by an increase in the cost function, a simulated annealing approach may be used to determine whether the next iteration of step 506 modifies the current order of the sets or the next iteration of step 506 continues to modify the prior order of the sets.

In one embodiment, simulated annealing accepts a current order that increases the value of the cost function with a probability that is inversely proportional to the magnitude of the delta. The constant of proportionality may be a factor that is the "temperature" of the simulated annealing. Initially, the temperature may be high causing modifications of the order of the sets that increase the value of the cost function to be frequently accepted. These iterations that increase the value of the cost function may move process 500 away from a local minimum of the cost function, such that a more global minimum of the cost function may be found. As process 500 proceeds, the temperature of the simulated annealing may be gradually reduced, such that modifications of the order of the sets that that increase the value of the cost function are less frequently accepted. When the temperature is reduced to zero, only modifications of the order of the sets of IOBs that decrease the value of the cost function are accepted to be modified in further iterations of step 506.

Decision 512 evaluates whether further iterations are likely to result in continued improvement in the value of the cost function. For improvement in the value of the cost function, process 500 iterates back to step 506. For sustained lack of improvement, process 500 may complete. In one embodiment, after the temperature of the simulated annealing is reduced to zero, process 500 completes when a number of consecutive iterations are performed without improvement in the value of the cost function. The value for this number of consecutive iterations may be a fixed value or a value based on the number of sets of IOBs and/or the number of IOBs.

In another embodiment, an order may also be generated for the functional blocks or certain types of functional blocks in step 506 and these functional blocks may be placed in step 508 in an ordered series of sites for these functional blocks on the integrated circuit. Example types of these functional blocks are complex functional blocks, such as block RAMs, multipliers, and digital signal processors (DSPs). The cost function of step 510 may include terms for these functional blocks. Step 506 may, for example, alternately modify the order of the sets and the order of these functional blocks. These complex functional blocks may be arranged on a PLD in irregular and sparse grids. The sparse grids of the components may be easily incorporated into the cost function and the relatively small number of the complex functional blocks may ensure that execution time is not adversely affected.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for placing input/output blocks of a circuit design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for placing a plurality of input/output blocks (IOBs) of an electronic design in an integrated circuit, comprising:
   assigning each IOB to one of a plurality of sets, wherein the electronic design includes at least one input/output bus associated with a plurality of the IOBs, and the plurality of IOBs for each input/output bus are assigned to a respective one of the sets;
   for each combination of pairs of the sets, each pair having a first set and a second set, generating a respective weight factor that indicates a degree of coupling between the first and second sets in the electronic design;
   generating an order of the sets;
   placing the sets, according to the order of the sets, in an ordered series of input/output sites in the integrated circuit;
   evaluating a cost function, including summing respective terms for each of the pairs of the sets, each respective term being a product of the respective weight factor for the pair and a distance between a center of the input/output sites of the first set of the pair and a center of the input/output sites of the second set of the pair; and
   conditionally repeating the generating of the order of the sets and the placing of the sets responsive to the evaluating of the cost function.

2. The method of claim 1, wherein each set is an ordered set having an order of the IOBs assigned to the set.

3. The method of claim 2, wherein the placement of the sets further places the IOBs assigned to each set in the ordered series of input/output sites in the order of the IOBs assigned to the set.

4. The method of claim 2, wherein the order of the IOBs assigned to a set for an input/output bus corresponds to an order provided by a definition of the input/output bus.

5. The method of claim 1, wherein each input/output bus is a vector and each bit of the vector has an associated one of the IOBs.

6. The method of claim 1, wherein the electronic design is represented in a memory with nodes representing blocks in the electronic design and edges representing nets connecting the blocks, and a path between nodes includes at least one edge, wherein the assigning of each IOB includes assigning each first IOB that is not associated with at least one input/output bus to one of the sets that includes a second IOB that is coupled to the first IOB as represented by a first path that has a fewer number of intermediate nodes than any other path representative of a coupling from the first IOB to an IOB other than the second IOB.

7. The method of claim 6, wherein the assigning includes determining the first path using a breadth-first search of the graph.

8. The method of claim 7, wherein assigning the first IOB includes identifying a representative path between the first and second IOBs having a number of intermediate nodes that is less than a separation limit.

9. The method of claim 6, wherein the assigning of each IOB further includes assigning the first IOB to the one of the sets that is compatible with the first IOB.

10. The method of claim 1, wherein the weight factor for the first and second sets is a sum of a respective term for each pairing of a first IOB of the first set and a second IOB of the second set, the respective term being an inverse of a separation between the first and second IOBs in the electronic design, and the separation being a minimum of a respective number of intermediate nodes along each of at least one representative path between the first and second IOBs in the electronic design.

11. The method of claim 1, wherein the weight factor for the first and second sets is a sum of a respective term for each pairing of a first IOB of the first set and a second IOB of the second set that has a separation between the first and second IOBs in the electronic design that is less than a separation limit, the respective term being an inverse of the separation, and the separation being a minimum of a respective number of intermediate nodes along each of at least one representative path between the first and second IOBs in the electronic design.

12. The method of claim 1, wherein the repeating of the generating of the order of the sets includes swapping positions in the order between two randomly selected ones of the sets.

13. The method of claim 1, wherein the ordered series of the input/output sites in the integrated circuit are arranged in one of a clockwise and counterclockwise order around a periphery of the integrated circuit.

14. The method of claim 1, wherein the ordered series of the input/output sites in the integrated circuit are arranged in a raster order.

15. The method of claim 1, wherein the ordered series of input/output sites includes ordered banks of the input/output sites, and for a first set followed by a second set in the order of the sets, the placing of the sets includes placing the first and second set in different banks responsive to the first and second sets of IOBs being incompatible.

16. The method of claim 1, wherein each center of the input/output sites of the first and second sets is a centroid of the respective input/output sites.

17. The method of claim 1, wherein the distance is a Manhattan distance.

18. The method of claim 1, wherein the repeating continues until the evaluating of the cost function indicates a lack of improvement over a number of repetitions.

19. The method of claim 1, wherein the conditionally repeating uses simulated annealing.

20. A processor-readable medium configured with executable instructions for placing a plurality of input/output blocks (IOBs) of an electronic design in an integrated circuit, the instructions when executed by a processor performing the steps including:

assigning each IOB to one of a plurality of sets, wherein the electronic design includes at least one input/output bus associated with a plurality of the IOBs, and the plurality of IOBs for each input/output bus are assigned to a respective one of the sets;

for each combination of pairs of the sets, each pair having a first set and a second set, generating a respective weight factor that indicates a degree of coupling between the first and second sets in the electronic design;

generating an order of the sets;

placing the sets, according to the order of the sets, in an ordered series of input/output sites in the integrated circuit;

evaluating a cost function, including summing respective terms for each of the pairs of the sets, each respective term being a product of the respective weight factor for the pair and a distance between a center of the input/output sites of the first set of the pair and a center of the input/output sites of the second set of the pair; and conditionally repeating the generating of the order of the sets and the placing of the sets responsive to the evaluating of the cost function.

\* \* \* \* \*